US010618077B2

(12) United States Patent
Calcagno et al.

(10) Patent No.: US 10,618,077 B2
(45) Date of Patent: Apr. 14, 2020

(54) METHOD OF CONTROLLING AMPLIFIERS, CORRESPONDING CIRCUIT AND DEVICE

(71) Applicant: STMicroelectronics S.r.l., Agrate Brianza (IT)

(72) Inventors: Giuseppe Calcagno, Messina (IT); Domenico Cristaudo, Tremenstrieri Etneo (IT); Stefano Corradi, Syracuse (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 370 days.

(21) Appl. No.: 15/586,777

(22) Filed: May 4, 2017

(65) Prior Publication Data

US 2018/0117630 A1    May 3, 2018

(30) Foreign Application Priority Data

Nov. 3, 2016    (IT) .......................... 102016000110367

(51) Int. Cl.
*B06B 1/02*    (2006.01)
*H03G 1/00*    (2006.01)
(Continued)

(52) U.S. Cl.
CPC .......... *B06B 1/0215* (2013.01); *B06B 1/0603* (2013.01); *B06B 1/0644* (2013.01);
(Continued)

(58) Field of Classification Search
CPC ... B06B 1/0215; B06B 1/0603; B06B 1/0644; H03F 1/02; H03F 1/0233; H03F 1/0255;
(Continued)

(56) References Cited

U.S. PATENT DOCUMENTS 8,027,489 B1    9/2011  Bacha et al.
8,680,918 B2    3/2014  Forejt et al.
(Continued)

FOREIGN PATENT DOCUMENTS

EP    1526638 A2    4/2005
EP    2824531 A1    1/2015
(Continued)

OTHER PUBLICATIONS

IT Search Report and Written Opinion for IT 102016000110367 dated Jun. 21, 2017 (7 pgs.).

*Primary Examiner* — Bryan P Gordon
(74) *Attorney, Agent, or Firm* — Crowe & Dunlevy

(57) ABSTRACT

A differential amplifier generates an output voltage waveform exhibiting a slew rate over a rise time. The amplifier is powered from a dc voltage input and includes a set of differential pairs having a bias current flowing therethrough and a Miller compensation capacitance. A comparator functions to compare a voltage at the dc voltage input against a reference voltage in order to detect when the voltage drops below the reference voltage. A gain stage controls the gain of the differential amplifier and a bias current control circuit controls the bias current of the differential amplifier. In response to the detection by the comparator of the voltage dropping below the reference voltage, the gain stage and the bias current control circuit decrease the gain of the amplifier and jointly decrease the bias current in order to maintain a value of the rise time.

14 Claims, 3 Drawing Sheets

(51) Int. Cl.
*H03F 3/45* (2006.01)
*H03G 3/00* (2006.01)
*B06B 1/06* (2006.01)
*H03F 1/02* (2006.01)
*H03G 3/20* (2006.01)

(52) U.S. Cl.
CPC ............ *H03F 1/02* (2013.01); *H03F 1/0233* (2013.01); *H03F 1/0255* (2013.01); *H03F 3/45* (2013.01); *H03F 3/45475* (2013.01); *H03G 1/00* (2013.01); *H03G 3/001* (2013.01); *H03G 3/007* (2013.01); *H03G 3/20* (2013.01); *H03F 2203/45248* (2013.01); *H03G 2201/40* (2013.01)

(58) Field of Classification Search
CPC . H03F 3/45; H03G 1/00; H03G 3/001; H03G 3/20
See application file for complete search history.

(56) References Cited

U.S. PATENT DOCUMENTS

| | | | | |
|---|---|---|---|---|
| 2005/0248389 | A1* | 11/2005 | Nguyen | H03F 3/45183 327/538 |
| 2010/0007419 | A1* | 1/2010 | Gilbert | H03F 1/302 330/254 |
| 2013/0106514 | A1* | 5/2013 | Forejt | H03F 3/211 330/255 |
| 2013/0272547 | A1* | 10/2013 | Waller, Jr. | H04R 3/00 381/120 |
| 2015/0162878 | A1* | 6/2015 | Ba | H03F 1/0233 330/251 |

FOREIGN PATENT DOCUMENTS

| | | |
|---|---|---|
| GB | 2436651 A | 10/2007 |
| JP | 2003188667 A | 7/2003 |

* cited by examiner

METHOD OF CONTROLLING AMPLIFIERS, CORRESPONDING CIRCUIT AND DEVICE

PRIORITY CLAIM

This application claims the priority benefit of Italian Application for Patent No. 102016000110367, filed on Nov. 3, 2016, the disclosure of which is hereby incorporated by reference in its entirety.

TECHNICAL FIELD

The description relates to amplifiers.

One or more embodiments may be applied in high voltage amplifiers for use in haptic drivers using piezoelectric actuators e.g. for multi touch application.

BACKGROUND

Haptic drivers are devices which may use vibration patterns and waveforms to convey information to a user or operator. Haptic drivers may use piezoelectric actuators (briefly "piezo" actuators) as vibrating components.

Haptic drivers may use different channels for driving external piezo actuators. Such a channel may include a digital-to-analog converter (DAC), a high voltage amplifier and a gain stage. In order to prevent system malfunction due to excessive current demand or give priority to other components, a so-called throttle block may be used which automatically starts to decrease channel gain, e.g. as a result of a monitored voltage drop below a programmed threshold.

A high voltage waveform may be used to generate vibration with a piezo actuator and convey the information to a user. A high voltage amplifier may be used to produce this waveform and a controlled slew rate is desirable during normal operation.

As a result of a battery voltage drop being detected by the throttle block, the gain of the amplifier is reduced automatically to preserve battery life duration; the throttling mechanism may thus result in the gain being reduced automatically with a possible change also in the waveform slew rate. Normal operation of the system may be difficult to achieve under these circumstances.

Changing the slew rate of the high gain amplifier change by taking into account the throttling mechanism may be considered, with proper functionality being however difficult to achieve.

There is a need in the art to overcome the drawbacks outlined in the foregoing, e.g., as related to slew rate control during a battery throttling function aimed at detecting voltage drops and reducing battery current consumption.

SUMMARY

One or more embodiments are related to a method, a corresponding circuit (e.g., for use with piezoelectric actuators) and a corresponding device (e.g., a haptic driver).

One or more embodiments may provide a (high voltage) amplifier for use in haptic drivers using (e.g., different) piezo actuators (e.g., for multi touch application).

One or more embodiments may facilitate achieving an internal controlled slew rate during the battery throttling mechanism in haptic driver application, e.g., by providing a constant rise time during the throttling mechanism.

One or more embodiments may provide a method of controlling the gain of a differential amplifier in generating an output voltage waveform, wherein said amplifier includes a dc voltage input, a set of differential pairs having a bias current flowing therethrough and a Miller compensation capacitance, wherein said amplifier exhibits a slew rate over a rise time, wherein said slew rate is a function of said bias current and said Miller capacitance, the method including:
- comparing the voltage at said dc voltage input against a reference voltage to detect the voltage at said dc voltage input dropping below said reference voltage; and
- as a result of detecting said voltage at said dc voltage input dropping below said reference voltage, decreasing the gain of said amplifier jointly with said bias current wherein said rise time is maintained.

One or more embodiments may include:
- generating a gain control signal indicative of the outcome of comparing said voltage at said dc voltage input against said reference voltage, and
- controlling said bias current as a function of said gain control signal.

One or more embodiments may include:
- generating said gain control signal as a multi-bit digital signal, and
- controlling said bias current as a function of at least one part of the bits in said multi-bit digital signal, said at least one part optionally including the most significant bits of said multi-bit digital signal.

In one or more embodiments, said decreasing the gain of said amplifier jointly with said bias current may include varying said bias current as a function of, optionally proportionally to, said gain of said amplifier.

One or more embodiments may provide a circuit, including:
- a differential amplifier for generating an output voltage waveform, said amplifier including a dc voltage input, a set of differential pairs having a bias current flowing therethrough and a Miller compensation capacitance, wherein said amplifier exhibits a slew rate over a rise time, wherein said slew rate is a function of said bias current and said Miller capacitance, the circuit including:
- a comparator block for comparing the voltage at said dc voltage input against a reference voltage to detect the voltage at said dc voltage input dropping below said reference voltage,
- a gain stage controlling the gain of said differential amplifier,
- a bias current control module controlling said bias current of said differential amplifier,
- wherein said gain stage and said bias current control module are coupled with said comparator block and configured for decreasing the gain of said amplifier jointly with said bias current as a result of said comparator block detecting said voltage at said dc voltage input dropping below said reference voltage, wherein said rise time is maintained.

One or more embodiments may include:
- said comparator block configured for generating a gain control signal indicative of the outcome of comparing said voltage at said dc voltage input against said reference voltage, and
- said bias current control module configured for controlling said bias current as a function of said gain control signal.

One or more embodiments may include:
- said comparator block configured for generating said gain control signal as a multi-bit digital signal, and said bias current control module configured for controlling said bias current as a function of at least one part of the bits in said multi-bit digital signal, said at least one part optionally including the most significant bits of said multi-bit digital signal.

In one or more embodiments said gain stage and said bias current control module may be coupled with said comparator block and configured for decreasing the gain of said amplifier jointly with said bias current by varying said bias current as a function of, optionally proportionally to, said gain of said amplifier.

One or more embodiments may provide a device, including:

a circuit according to one or more embodiments, and
a load coupled with the output of said differential amplifier to receive said output voltage waveform from said differential amplifier.

In one or more embodiments said load may include a piezoelectric actuator.

In one or more embodiments the device may include a haptic driver.

The extent of protection is defined by the annexed claims.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

By way of general background, haptic technology, or "haptics", is a method of providing a tactile feedback response to a designated input. Derived from the Greek word "haptikos", haptics is the scientific discipline that is concerned with touch. It may be resorted to in electronic devices to recreate the sense of touch to a user, e.g., through vibrations or forces. The basic components for producing and regulating haptic feedback may include a microcontroller, a mechanical driver and an actuator.

Piezoelectric actuators (or, simply, "piezo" actuators) may include thin layers of piezoelectric materials that bend back and forth quickly when a voltage is applied, causing vibration. This bending of piezo actuators may involve applying thereto a relatively high voltage input from a driver, usually between 50 and 150 volts. To provide this high voltage, the system may include a piezo-specific haptic driver.

The designation "throttle mechanism" denotes the mechanism by means of which a battery voltage drop is detected and the battery current consumption automatically reduced.

Figure 1:
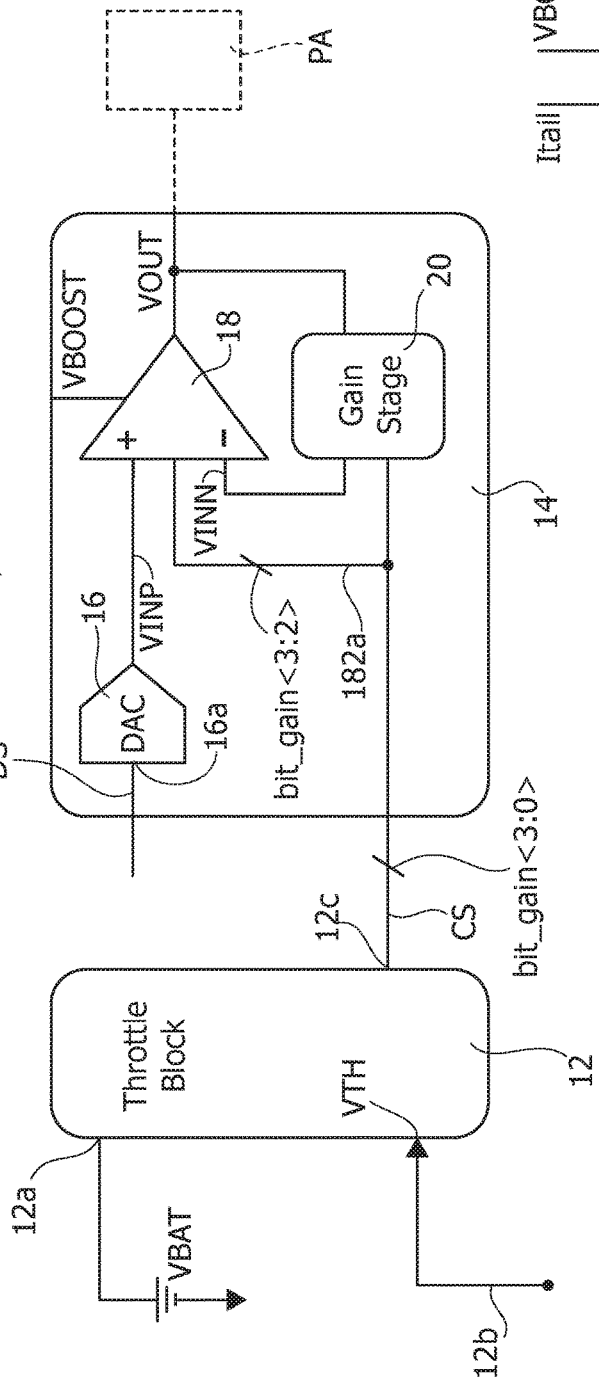
FIG. 1 is block diagram exemplary of one or more embodiments.

FIG. 1 is a block diagram exemplary of a circuit 10 intended to be fed with a dc (e.g., battery) supply voltage VBAT and to generate a (high) voltage waveform VOUT which may be used, e.g., to generate vibration in a piezo actuator PA (which per se may be a distinct element from the embodiments).

A throttle block 12 may sense the voltage level of the battery VBAT on a sensing input 12a, and compare it with a reference voltage (VTH), that may be user-programmable, e.g., via a reference input 12b.

A logic signal generated as a result of such a comparison may be processed (in a manner known per se) by internal control logic of the throttle block 12 to produce over an output line 12c a control signal CS to control (e.g., reduce) automatically the (voltage) gain of a processing block (channel) 14 which produces the signal VOUT (when the device 10 is operative in an active state with output enabled).

The block 14 may include a digital-to-analog converter (DAC) 16 to convert an input digital stream DS on an input 16a (from a digital generator referred to a digital supply voltage Vdd, not visible in the figures) into an analog drive signal applied to an (e.g., positive, non-inverting) input VINP of a (high) voltage amplifier 18 (e.g., a high-voltage operational amplifier—HV OPAMP). In one or more embodiments the amplifier 18 may thus apply a corresponding (high-voltage) signal VOUT to the load PA (e.g., a piezo actuator).

A gain stage 20 sensitive to the control signal CS may be coupled to an (e.g. negative, inverting) input VINN of the amplifier 18 in order to vary the gain of the amplifier 18 as a function of the battery voltage VBAT detected by the throttle block 12. The control signal CS for the block 14 (e.g. the gain stage 20) may include four bits, e.g. Bit_gain<3:0>.

The amplifier 18 may include a high voltage amplifier to drive the piezo actuator PA with an internal slew rate which may be limited.

The block (channel) 14 may generate a step function with, e.g., 90 Vpp amplitude and with a constant rise time of, e.g., 87 microseconds (1 microsecond=$1 \times 10^{-6}$ s), with rise time calculated from 10% to 90% of the output voltage.

Figure 2:
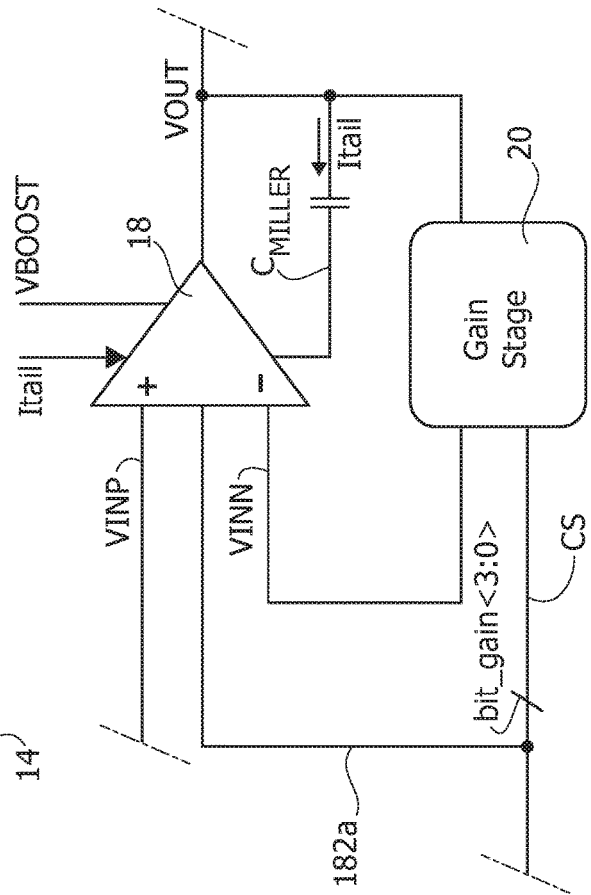
FIG. 2 is a circuit diagram exemplary of possible characteristics of embodiments.

As exemplified in FIG. 2 such an internal slew rate may be determined by a current represented as Itail (this is in fact a bias current flowing through the differential pairs of the high voltage amplifier 18) and by a internal (compensation) Miller capacitance $C_{MILLER}$.

The bias current Itail for the differential pairs of the amplifier 18 may be derived, e.g., from VBOOST, the supply voltage for the high voltage amplifier.

Figure 3:
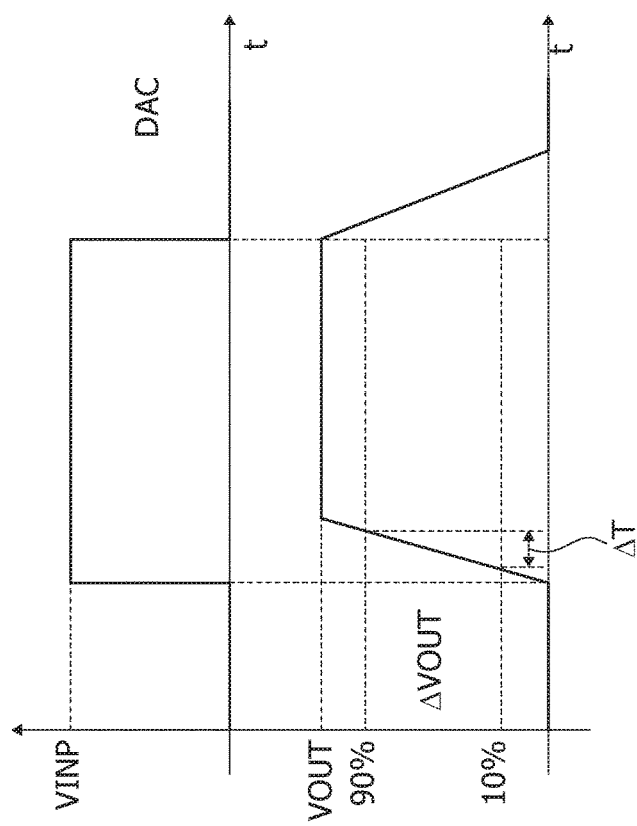
FIG. 3 is a diagram exemplary of a possible time behaviour of certain signals in one or more embodiments.

As schematically represented in the diagram of FIG. 3, during a positive step function generation, when a controlled slew rate SR is desirable, the tail current Itail may flow through the Miller capacitance $C_{MILLER}$ and the following equation may apply:

$$SR = \Delta VOUT/\Delta T = Itail/C_{MILLER}$$

where:
the slew rate SR may be is calculated, e.g., between the 10% and 90% of the output voltage;
ΔVOUT is the output voltage value; and
ΔT is the rise time.

As a result of a battery voltage drop being detected by the throttling block 12, the output voltage VOUT may be reduced due to the action of the gain stage 20. In this situation, if both Itail and $C_{MILLER}$ are assumed to be fixed, the rise time ΔT will change proportionally to VOUT, e.g., with the rise time ΔT changing following the variations of VOUT, e.g.:

$$\Delta T = \Delta VOUT/xItail/C_{MILLER} = VINP \times GAIN \times C_{MILLER}/Itail$$

As a result of a drop in the battery voltage VBAT being detected by the throttle block 12, the tail current Itail may decrease proportionally to VOUT:

$$Itail = VINP \times GAIN \times C_{MILLER}/\Delta T$$

One may observe that in the equation above, if the input signal voltage VINP, the compensation capacitance $C_{MILLER}$ and the rise time ΔT are assumed fixed by design, only the gain value (GAIN) will change in the equation, due to the throttling block 12 and its internal logic.

Figure 4:
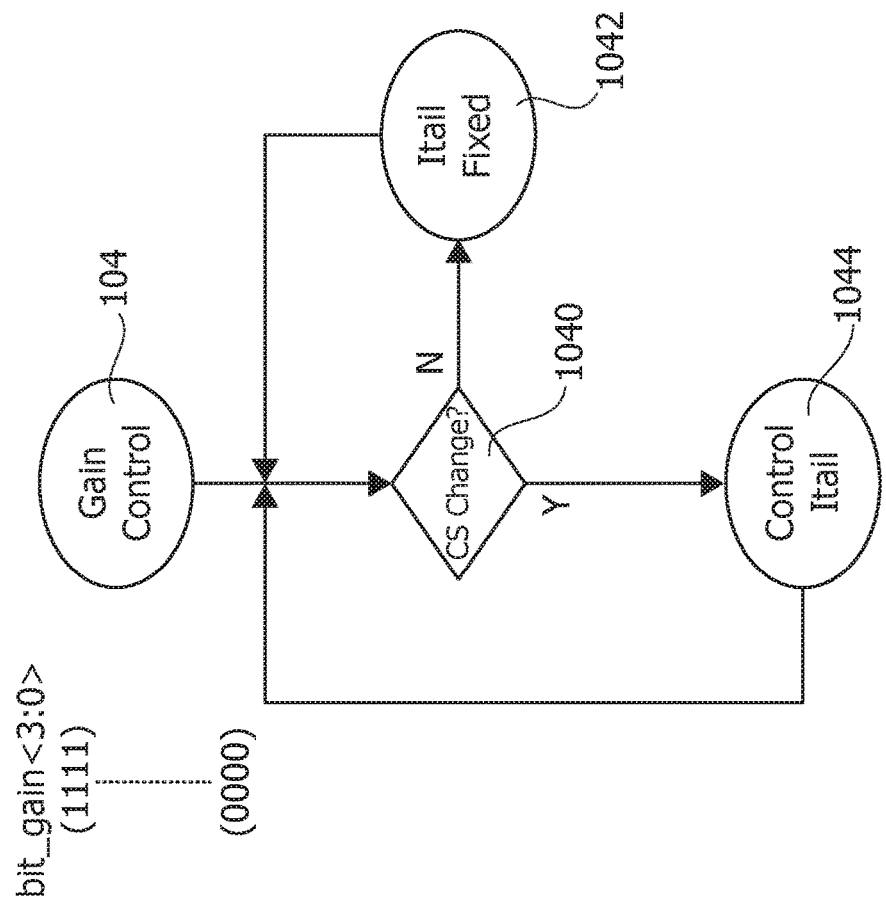
FIG. 4 is a flow chart exemplary of possible operation of one or more embodiments.

The flowchart of FIG. 4 is generally exemplary of throttling control, where the following designations apply to the blocks shown:

100: off state;
102: switching to active state with check as to VBAT<VTH; if check outcome is negative (NO), back to upstream of step 102;
104: gain control (decrease) as a result of check in step 102 yielding a positive outcome (Y);
106: check as to whether active state is to be maintained; if outcome is positive (Y), back to upstream of step 104; if negative (N) back to off state of block 100.

Figure 5:
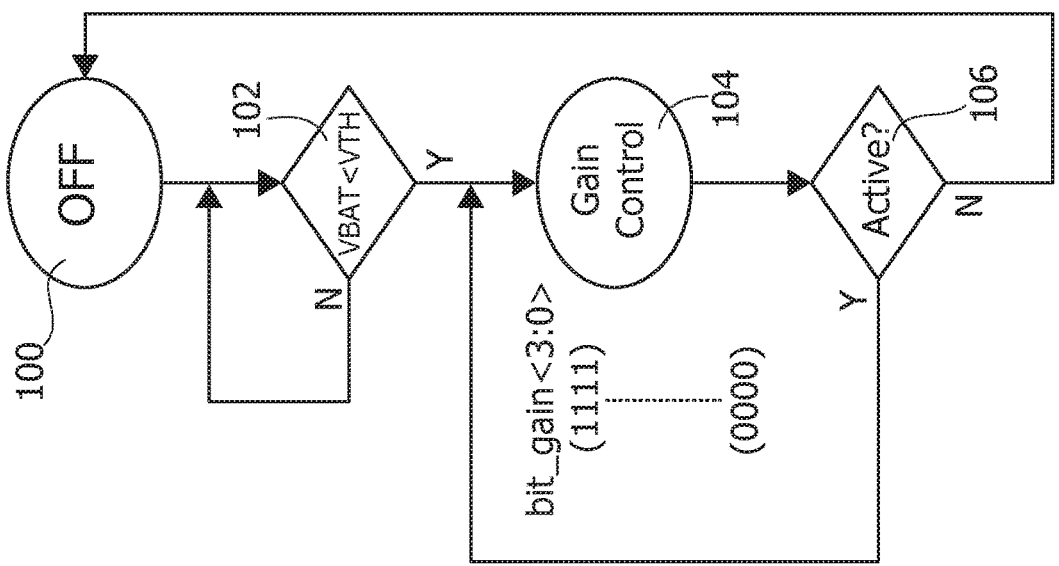
FIG. 5 is a flow chart exemplary of possible operation of one or more embodiments.

The flowchart of FIG. 5 is exemplary of gain control (with joint control of the tail current Itail) according to one or more embodiments, where the following designations apply to the blocks shown:

104: gain control (decrease)—see FIG. 4—followed by check in step 1040 if control signal CS has changed (which information may be conveyed, e.g., as bit_gain<3:2>, as discussed in the following);
1042: if outcome of check in step 1040 negative (N): current Itail kept fixed, back to upstream of step 1040;
1044: if outcome of check in step 1040 is positive (Y): current Itail kept controlled (decreased), back to upstream of step 1040.

In one or more embodiments, the circuit 10 may thus exhibit a fixed rise time ΔT due to the fact that the tail current Itail—which in conventional arrangements is fixed, thus leading to the dependency of ΔT on ΔVOUT as discussed previously—is made variable, e.g., may be changed as a function (e.g. proportionally) to the gain value, e.g., via a control signal applied over a line 182a (not present in conventional arrangements).

The table below is exemplary of possible values in operation as exemplified above

| VBAT | Bit_gain<3:2> | Gain (dB) | Itail |
|---|---|---|---|
| >VTH | 1111 | 40 | ITAIL1 |
| <VTH | 1110 | 39.5 | ITAIL1 |
| <VTH | 1101 | 39 | ITAIL1 |
| <VTH | 1100 | 38.5 | ITAIL1 |
| <VTH | 1011 | 38 | ITAIL2 |
| <VTH | 1010 | 37.5 | ITAIL2 |
| <VTH | 1001 | 37 | ITAIL2 |
| <VTH | 1000 | 36.5 | ITAIL2 |
| <VTH | 0111 | 36 | ITAIL3 |
| <VTH | 0110 | 35.5 | ITAIL3 |
| <VTH | 0101 | 35 | ITAIL3 |
| <VTH | 0100 | 34.5 | ITAIL3 |
| <VTH | 0011 | 34 | ITAIL4 |
| <VTH | 0010 | 33.5 | ITAIL4 |
| <VTH | 0001 | 33 | ITAIL4 |
| <VTH | 0000 | 32.5 | ITAIL4 |

Figure 6:
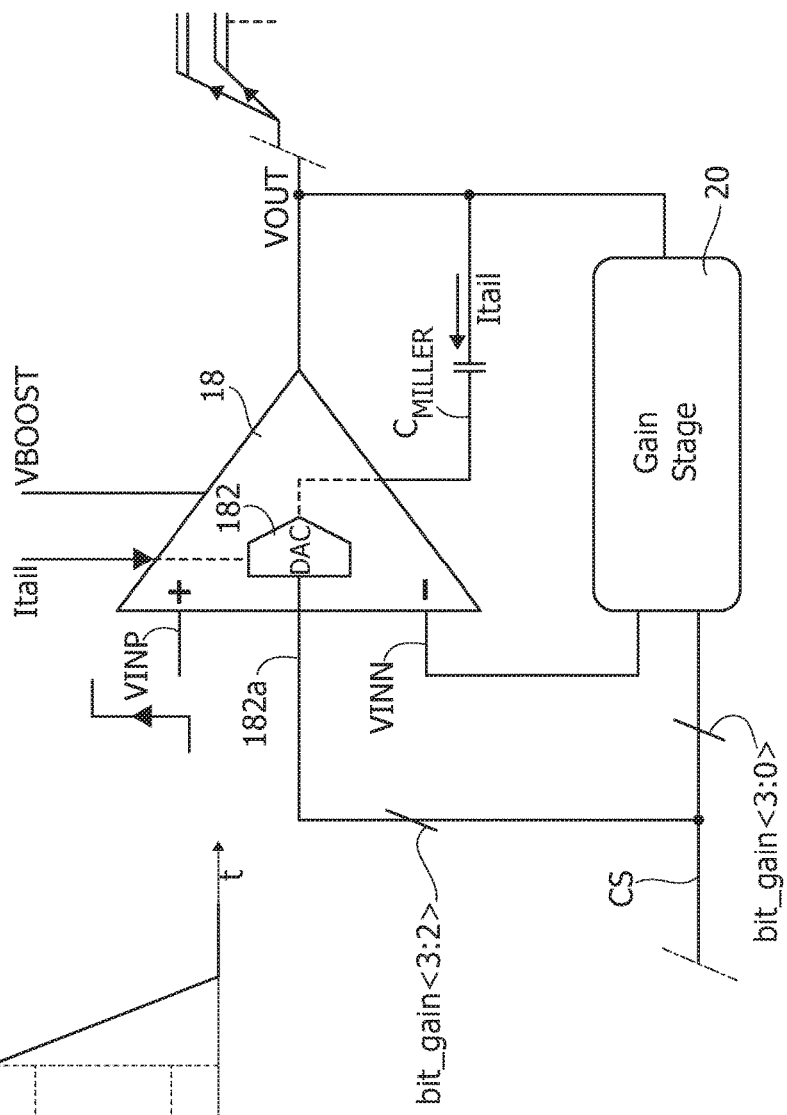
FIG. 6 is a circuit diagram exemplary of possible characteristics of embodiments.

FIG. 6 is a circuit diagram further exemplary of possible characteristics of embodiments. In FIG. 6, parts or elements already introduced in connection with FIGS. 1 and 2 are indicated with the same references, thus making it unnecessary to repeat a description thereof.

As exemplified in FIG. 6, in one or more embodiments the two most significant bits of the bit_gain <3:0>signal CS, e.g., bit_gain<3:2>, as conveyed, e.g., over the line 182a to a digital-to-analog converter (DAC) 182, e.g., in the amplifier 18 to change the tail current Itail in the amplifier 18, while setting at the same time the rise time ΔT (e.g., to maintain it at a substantially constant value, without being affected by VOUT).

The following tables are exemplary of values/parameters which may be used/obtained in one or more embodiments:

| Parameter | Value | Unit | Comment |
|---|---|---|---|
| Bit_gain<3:0> | 4 | bit | 4 bit used |
| VBOOST | 116 | V | HV OPAMP Supply voltage |
| $C_{MILLER}$ | 10.8 | pF | Miller capacitor |
| VINP | 0.9 | V | Output DAC |
| ΔT | 86.4 | microsec | Fixed Rise Time |

| bit_gain<3> | bit_gain<2> | bit_gain<1> | bit_gain<0> | GAIN | VOUT | Itail (microA) |
|---|---|---|---|---|---|---|
| 0 | 0 | 0 | 0 | 100 | 90 | 10 |
| 0 | 0 | 0 | 1 | 94.4061 | 84.9 | 10 |
| 0 | 0 | 1 | 0 | 89.1251 | 80.2 | 10 |
| 0 | 0 | 1 | 1 | 84.1395 | 75.7 | 10 |
| 0 | 1 | 0 | 0 | 79.4328 | 71.5 | 8 |
| 0 | 1 | 0 | 1 | 74.9894 | 67.5 | 8 |
| 0 | 1 | 1 | 0 | 70.7946 | 63.7 | 8 |
| 0 | 1 | 1 | 1 | 66.8344 | 60.2 | 8 |
| 1 | 0 | 0 | 0 | 63.0957 | 56.8 | 6 |

-continued

| bit_gain<3> | bit_gain<2> | bit_gain<1> | bit_gain<0> | GAIN | VOUT | Itail (microA) |
|---|---|---|---|---|---|---|
| 1 | 0 | 0 | 1 | 59.5662 | 53.6 | 6 |
| 1 | 0 | 1 | 0 | 56.2341 | 50.6 | 6 |
| 1 | 0 | 1 | 1 | 53.0884 | 47.6 | 6 |
| 1 | 1 | 0 | 0 | 50.1187 | 45.1 | 5 |
| 1 | 1 | 0 | 1 | 47.3151 | 42.6 | 5 |
| 1 | 1 | 1 | 0 | 44.6684 | 40.2 | 5 |
| 1 | 1 | 1 | 1 | 42.1697 | 37.9 | 5 |

It will be otherwise understood that the values/parameters reported in the foregoing are merely exemplary and should not construed, even indirectly, as limitative of the embodiments.

This applies, e.g., to the choice of using two bits to change the current Itail in the amplifier 18. In one or more embodiments, e.g., all of the four bits of the control signal CS may be used to change the current Itail, thus increasing control resolution.

One or more embodiments may thus provide a method of controlling the gain (e.g., at 20) of a differential amplifier (e.g., 18) in generating an output voltage waveform (e.g., VOUT), wherein said amplifier includes a dc voltage input (e.g., VBAT at 12a), a set of differential pairs having a bias current (Itail, 182) flowing therethrough and a Miller compensation capacitance (e.g., $C_{MILLER}$), wherein said amplifier exhibits a slew rate (e.g., SR) over a rise time (e.g., $\Delta T$), wherein said slew rate is a function of said bias current and said Miller capacitance, the method including:
  comparing (e.g., within 12) the voltage at said dc voltage input against a reference voltage (e.g., VTH) to detect the voltage at said dc voltage input dropping below said reference voltage; and
  as a result of detecting said voltage at said dc voltage input dropping below said reference voltage, decreasing the gain of said amplifier jointly with said bias current wherein said rise time is maintained.

One or more embodiments may include:
  generating a gain control signal (e.g., CS; bit_gain<3:0>) indicative of the outcome of comparing said voltage at said dc voltage input against said reference voltage, and
  controlling (e.g., 182; bit_gain<3:2>) said bias current as a function of said gain control signal.

One or more embodiments may include:
  generating said gain control signal as a multi-bit digital signal (e.g., bit_gain<3:0>), and
  controlling (e.g., 182) said bias current as a function of at least one part (e.g., bit_gain<3:2>) of the bits in said multi-bit digital signal, said at least one part optionally including the most significant bits of said multi-bit digital signal.

In one or more embodiments, said decreasing the gain of said amplifier jointly with said bias current may include varying said bias current as a function of, optionally proportionally to, said gain of said amplifier.

One or more embodiments may provide a circuit (e.g., 10), including:
  a differential amplifier for generating an output voltage waveform, said amplifier including a dc voltage input, a set of differential pairs having a bias current flowing therethrough and a Miller compensation capacitance, wherein said amplifier exhibits a slew rate over a rise time, wherein said slew rate is a function of said bias current and said Miller capacitance, the circuit including:
    a comparator block for comparing the voltage at said dc voltage input against a reference voltage to detect the voltage at said dc voltage input dropping below said reference voltage,
    a gain stage controlling (e.g., VINN) the gain of said differential amplifier,
    a bias current control module controlling said bias current of said differential amplifier,
    wherein said gain stage and said bias current control module are coupled with said comparator block and configured for decreasing the gain of said amplifier jointly with said bias current as a result of said comparator block detecting said voltage at said dc voltage input dropping below said reference voltage, wherein said rise time is maintained.

One or more embodiments may include:
  said comparator block configured for generating a gain control signal indicative of the outcome of comparing said voltage at said dc voltage input against said reference voltage, and
  said bias current control module configured for controlling said bias current as a function of said gain control signal.

One or more embodiments may include:
  said comparator block configured for generating said gain control signal as a multi-bit digital signal, and
  said bias current control module configured for controlling said bias current as a function of at least one part of the bits in said multi-bit digital signal, said at least one part optionally including the most significant bits of said multi-bit digital signal.

In one or more embodiments said gain stage and said bias current control module may be coupled with said comparator block and configured for decreasing the gain of said amplifier jointly with said bias current by varying said bias current as a function of, optionally proportionally to, said gain of said amplifier.

One or more embodiments may provide a device, including:
  a circuit according to one or more embodiments, and
  a load (e.g. PA) coupled with the output of said differential amplifier to receive said output voltage waveform from said differential amplifier.

In one or more embodiments said load may include a piezoelectric actuator.

In one or more embodiments the device may include a haptic driver.

Without prejudice to the underlying principles, the details and embodiments may vary, even significantly, with respect to what has been disclosed by way of example only, without departing from the extent of protection.

The invention claimed is:
1. A method of controlling the gain of a differential amplifier in generating an output voltage waveform, wherein said differential amplifier includes a dc voltage input, a set of differential pairs having a bias current flowing therethrough and a Miller compensation capacitance, wherein said differential amplifier exhibits a slew rate over a rise time, wherein said slew rate is a function of said bias current and said Miller capacitance, the method including:

comparing a voltage at said dc voltage input against a reference voltage to detect whether the voltage drops below said reference voltage; and as a result of detecting that said voltage has dropped below said reference voltage, jointly decreasing a gain of said differential amplifier and decreasing said bias current in a manner where said rise time is maintained compared to said rise time when the voltage was above said reference voltage, wherein jointly decreasing comprises:

generating a multi-bit digital control signal including a first plurality of control bits and a second plurality of control bits as a function of an outcome of comparing said voltage at said dc voltage input against said reference voltage;

controlling said gain of the differential amplifier as a function of the first and second pluralities of control bits of said multi-bit digital control signal; and controlling said bias current as a function of only the first plurality of control bits of said multi-bit digital control signal.

2. The method of claim 1, wherein the first plurality of control bits are the most significant bits of said multi-bit digital control signal.

3. The method of claim 1, wherein controlling the bias current comprises varying said bias current as a function of said gain of said differential amplifier.

4. The method of claim 3, wherein varying comprises proportionally varying.

5. A circuit, including:

a differential amplifier configured to generate an output voltage waveform, said differential amplifier including a dc voltage input, a set of differential pairs having a bias current flowing therethrough and a Miller compensation capacitance, wherein said differential amplifier exhibits a slew rate over a rise time, wherein said slew rate is a function of said bias current and said Miller capacitance, a comparator configured to compare a voltage at said dc voltage input against a reference voltage to detect a drop of the voltage below said reference voltage and generate a multi-bit digital control signal including a first plurality of control bits and a second plurality of control bits as a function of the comparison of said voltage at said dc voltage input against said reference voltage, a gain stage configured to control a gain of said differential amplifier as a function of the first and second pluralities of control bits of said multi-bit digital control signal, and a bias current control circuit configured to control said bias current of said differential amplifier as a function of only the first plurality of control bits of said multi-bit digital control signal, wherein said gain stage and said bias current control circuit are coupled with said comparator and configured to jointly decrease the gain of said amplifier and decrease said bias current if said comparator detects that said voltage has dropped below said reference voltage in a manner where said rise time is maintained compared to said rise time when the voltage was above said reference voltage.

6. The circuit of claim 5, wherein the first plurality of control bits are the most significant bits of said multi-bit digital control signal.

7. The circuit of claim 5, wherein said gain stage and said bias current control circuit are coupled with said comparator and configured to jointly decrease the gain of said amplifier and decrease said bias current by varying said bias current as a function of said gain.

8. The circuit of claim 7, wherein varying comprises proportionally varying.

9. The circuit of claim 5, further including a load coupled with the output of said differential amplifier to receive said output voltage waveform from said differential amplifier.

10. The circuit of claim 9, wherein said load includes a piezoelectric actuator.

11. The circuit claim 5, wherein the circuit is a component of a haptic driver.

12. A circuit, comprising:

a voltage amplifier having an inverting input and a non-inverting input and further having an amplifier output, the voltage amplifier further including a digital-to-analog converter circuit having an input and further having a converter output;

a Miller capacitor having a first terminal connected to the amplifier output and a second terminal connected to the converter output;

a gain stage having an input and further having an output connected to the inverting input of the voltage amplifier; and a comparator configured to compare an input voltage against a reference voltage and generate a multi-bit digital control signal as a function of the comparison of said voltage against said reference voltage for application to the input of the gain stage for setting a gain of the voltage amplifier and for application to the input of the digital-to-analog converter circuit for setting a tail current applied to the Miller capacitor.

13. The circuit of claim 12, wherein the multi-bit digital control signal includes a first plurality of control bits and a second plurality of control bits;

wherein the first and second pluralities of control bits of said multi-bit digital control signal are applied to the input of the gain stage for setting the gain of the voltage amplifier; and wherein only the first plurality of control bits of said multi-bit digital control signal are applied to the input of the digital-to-analog converter circuit for setting the tail current applied to the Miller capacitor.

14. The circuit of claim 13, wherein the first plurality of control bits are the most significant bits of said multi-bit digital control signal.

* * * * *